(12) United States Patent
Gu

(10) Patent No.: US 7,054,218 B2
(45) Date of Patent: May 30, 2006

(54) SERIAL MEMORY ADDRESS DECODING SCHEME

(75) Inventor: Chen Gu, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/927,880

(22) Filed: Aug. 26, 2004

(65) Prior Publication Data

US 2006/0044920 A1   Mar. 2, 2006

(51) Int. Cl.
*G11C 8/00* (2006.01)

(52) U.S. Cl. ............ 365/230.06; 365/230.09; 365/233; 365/236; 365/239; 365/240

(58) Field of Classification Search .......... 365/233, 365/236, 239, 240, 230.06, 230.09
See application file for complete search history.

(56) References Cited

U.S. PATENT DOCUMENTS

| | | | | |
|---|---|---|---|---|
| 3,990,050 A | * | 11/1976 | Kolettis et al. ........... 710/23 |
| 4,075,422 A | * | 2/1978 | Baker ................... 178/23 R |
| 4,499,498 A | * | 2/1985 | Iinuma .................... 341/63 |
| 4,528,662 A | * | 7/1985 | Floyd et al. ............. 370/216 |
| 4,551,720 A | * | 11/1985 | Levin ................ 340/825.52 |
| 5,018,109 A | * | 5/1991 | Shinoda et al. ...... 365/230.08 |
| 5,566,124 A | * | 10/1996 | Fudeyasu et al. ..... 365/230.06 |
| 5,617,368 A | * | 4/1997 | Ishida .................... 365/221 |
| 5,748,201 A | * | 5/1998 | Nagasaka ............... 345/554 |
| 5,825,713 A | * | 10/1998 | Lee .................... 365/230.05 |
| 6,170,027 B1 | * | 1/2001 | Lu et al. .................. 710/65 |
| 6,421,757 B1 | * | 7/2002 | Wang et al. ............ 711/103 |

* cited by examiner

*Primary Examiner*—Viet Q. Nguyen
(74) *Attorney, Agent, or Firm*—Lanny L. Parker

(57) ABSTRACT

A decode circuit for a memory that uses "sequential addressing" includes a series of decoders form a shift register that may be used to provide either wordlines or column select lines for accessing the memory. A pulse generator supplies an appropriate number of pulses to the series of decoders in accordance with a difference in a stored previous address and a received current address.

18 Claims, 4 Drawing Sheets

SERIAL MEMORY ADDRESS DECODING SCHEME

Address decoding circuits typically use "parallel decoding", where address lines are uniquely decoded to provide individual memory addresses. This traditional scheme requires large silicon spaces to route address lines and provide decode transistors. Improvements in decoding schemes are desired.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
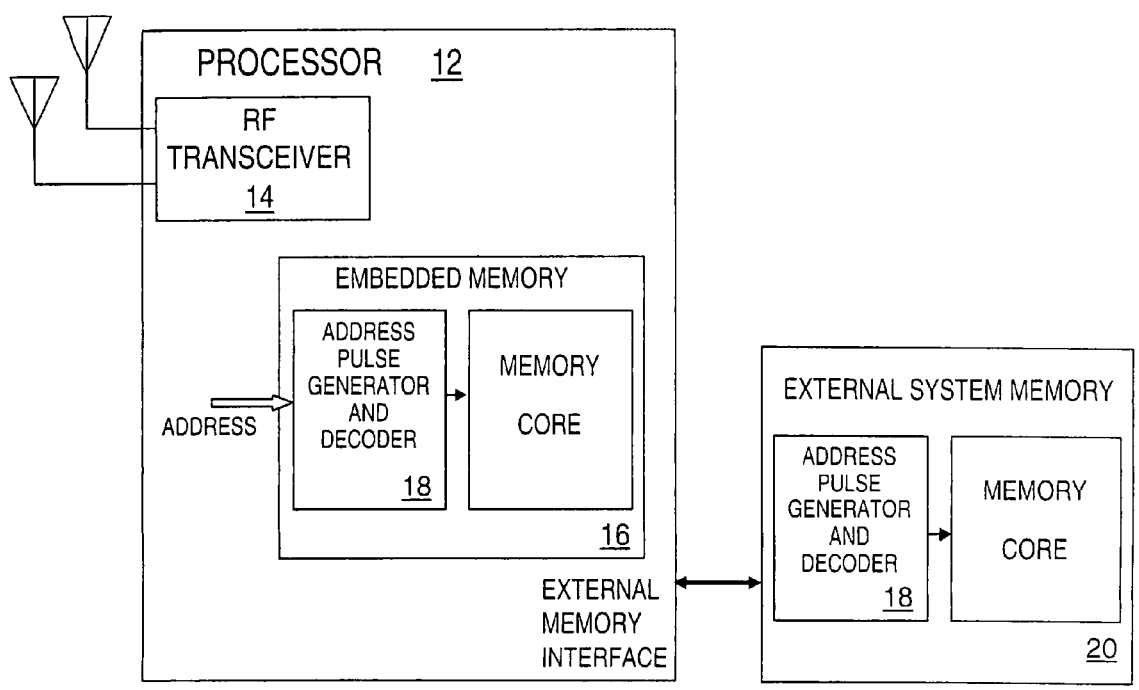
FIG. 1 is a diagram that illustrates a wireless system that includes an address pulse generator and decoder that may be incorporated into memory devices.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

FIG. 1 illustrates features of the present invention that may be incorporated, for example, into a wireless communications device 10, although the claimed subject matter of the present invention may be incorporated into other applications. In the wireless communications embodiment, a transceiver 14 both receives and transmits a modulated signal from one or more antennas. The analog front end transceiver may be a stand-alone Radio Frequency (RF) integrated analog circuit, or alternatively, be embedded with a processor 12 as a mixed-mode integrated circuit. The received modulated signal may be frequency down-converted, filtered, then converted to a baseband, digital signal. Processor 12 may include baseband and applications processing functions, and in general, be capable of fetching instructions, generating decodes, finding operands, performing the appropriate actions and storing results.

The digital data processed by processor 12 may be stored internally in an embedded memory 16 or transferred across an interface for storage by a system memory 20. Embedded memory 16 and system memory 20 may include a variety or combination of memories. As such, the storage devices may be volatile memories such as, for example, a Static Random Access Memory (SRAM), a Dynamic Random Access Memory (DRAM) or a Synchronous Dynamic Random Access Memory (SDRAM), although the scope of the claimed subject matter is not limited in this respect. In other embodiments, the memory devices may be nonvolatile memories such as, for example, an Electrically Programmable Read-Only Memory (EPROM), an Electrically Erasable and Programmable Read Only Memory (EEPROM), a Flash memory, a Ferroelectric Random Access Memory (FRAM), a Polymer Ferroelectric Random Access Memory (PFRAM), a Magnetic Random Access Memory (MRAM), an Ovonics Unified Memory (OUM) or any other device capable of storing instructions and/or data. However, it should be understood that the scope of the present invention is not limited to these examples.

Embodiments of the present invention for either embedded memory 16 or system memory 20 utilize serial memory decoding to provide memory addresses for applications that may include general-purpose microprocessors, Digital Signal Processors (DSPs), Reduced Instruction-Set Computing (RISC), Complex Instruction-Set Computing (CISC), among other processing components. In addition, embodiments of the present invention may have applications in smart phones, communicators and Personal Digital Assistants (PDAs), medical or biotech equipment, automotive safety and protective equipment, and automotive infotainment products. However, it should be understood that the scope of the present invention is not limited to these examples.

Figure 2:
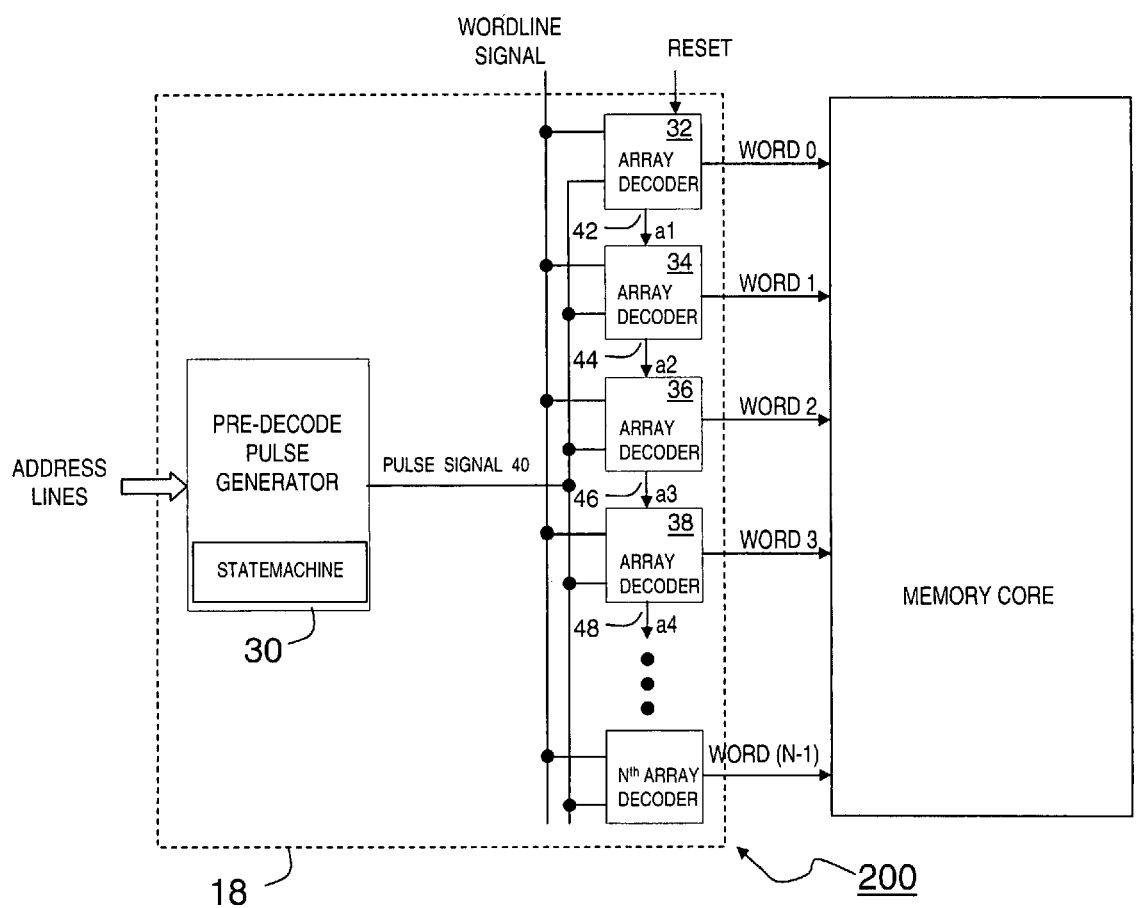
FIG. 2 is a diagram that illustrates one embodiment for the address pulse generator and row decoder to generate wordlines to access data in a memory core in accordance with the present invention.

FIG. 2 is a diagram that illustrates one embodiment of address pulse generator and decoder 18 used as a row decoder 200 in providing wordlines to a memory core in accordance with the present invention. In memories that use "sequential addressing", data may be read from consecutive addresses, i.e., addresses 0h, 1h, 2h, 3h, 4h, etc. in sequence. Address pulse generator and decoder 18 may be used with memories that use "sequential addressing". Address pulse generator and decoder 18 includes a pre-decode pulse generator 30 and N array decoders, e.g., array decoders 32, 34, 36, 38, . . . (N–1). Pre-decode pulse generator 30 receives ADDRESS LINES and generates a PULSE SIGNAL that is commonly supplied to the N array decoders. The N array decoders further receive a WORDLINE SIGNAL that may be used to gate or enable the decoders when accessing the individual rows of the memory core.

Pre-decode pulse generator 30 receives a new address from the ADDRESS LINES that is supplied to the memory device. In one embodiment pre-decode pulse generator 30 is a state machine, although the state machine implementation should not be a limitation of the claimed invention and other circuit implementations using decoding logic along with latches are anticipated. Pre-decode pulse generator 30 generates the PULSE SIGNAL output, providing a variable number of pulses, the number of pulses corresponding to a difference in addresses between the new address and the current address (the current address may be locally stored with the generator).

Figure 3:
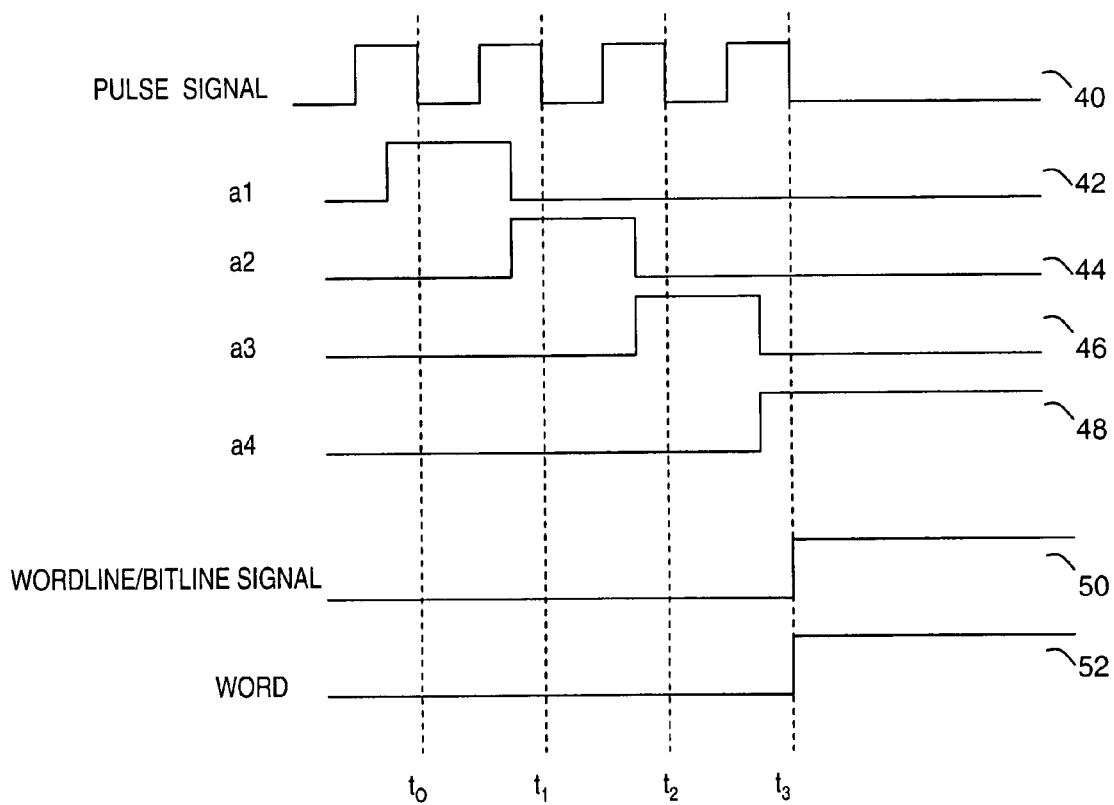
FIG. 3 illustrates timing signals used or generated by the address pulse generator and decoder.

FIG. 3 illustrates timing signals used and/or generated by the address pulse generator and decoder 18. Referring to both FIG. 2 and FIG. 3, pre-decode pulse generator 30 receives the new address, then compares the new address with the address currently stored to determine a difference. For simplicity and by way of example, the new address may differ by four from the address currently stored by pre-decode pulse generator 30, and consequently, PULSE SIGNAL 40 generated by pre-decode pulse generator 30 includes four pulses.

The N array decoders, e.g., array decoders 32, 34, 36, 38, . . . , (N−1), are arranged as an N bit-shift register to respectively provide outputs WORD 0, WORD 1, WORD 2, WORD 3, . . . , and WORD (N−1) to the memory core. The array decoders receive the synchronous train of pulses in PULSE SIGNAL 40 along with the WORDLINE SIGNAL, and generate the wordlines for the memory cores. As an exemplary starting point, array decoder 32 may provide an active WORD 0 to the memory core, with other wordlines being inactive. When the array decoders receive the first of the four pulses in PULSE SIGNAL 40, array decoder 32 activates the signal "a1" (as denoted by reference number 42) on the transition of the WORDLINE SIGNAL at time $t_0$. Then, array decoder 32 deactivates WORD 0 and array decoder 34 generates an active WORD 1 to the memory core, with other wordlines being inactive.

Figure 4:
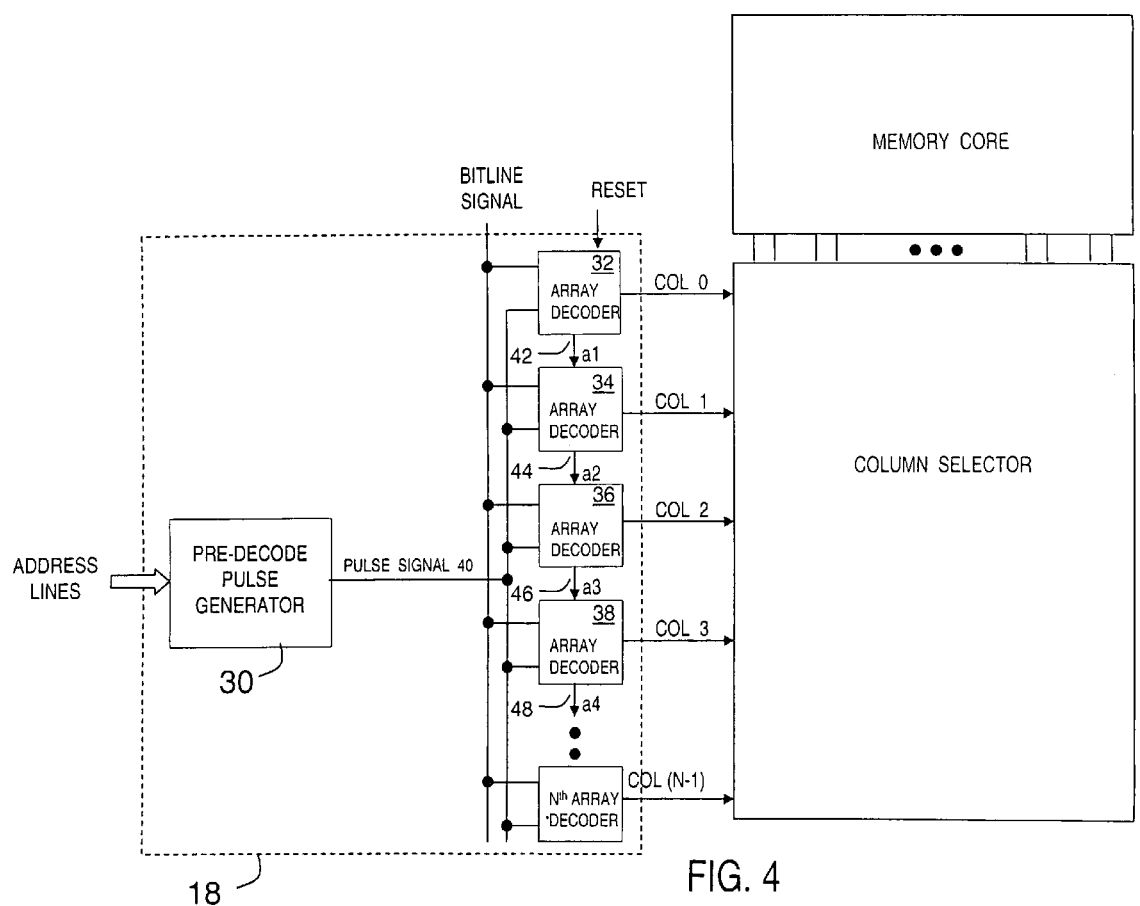
FIG. 4 illustrates another embodiment of the address pulse generator and column decoder in accordance with the present invention.

To continue with the example, the second of the four pulses in PULSE SIGNAL 40 causes array decoder 36 to activate the signal "a2" (as denoted by reference number 44) on the transition of the WORDLINE SIGNAL at time $t_1$. Then, array decoder 34 deactivates WORD 1 and array decoder 36 activates WORD 2 to the memory core, with other wordlines being inactive. Each addition pulse on PULSE SIGNAL 40 shifts a "1" down the array decoder (shift register chain), activating the signal "a3" (as denoted by reference number 46), then activating the signal "a4" (as denoted by reference number 48), and sequentially activating the following wordlines. Briefly referring to FIG. 3, note that the timing for either the WORDLINE SIGNAL used in FIG. 2 or the BITLINE SIGNAL used in FIG. 4 is denoted by reference number 50. Further, the timing of the signals at the outputs of the array decoders is labeled WORD and denoted by the reference number 52.

Thus, embedded memory 16 and/or system memory 20 may utilize serial memory decoding to sequence from a previous address (the locally stored address) to the present address (the new address on the ADDRESS LINES). By using the appropriate pulses that are generated based on the difference between the previous address and the present address, the array decoders propagate a "1" or "on" state from one array decoder in sequence to the next array decoder. The memory core may be accessed and read or programmed as each wordline is activated. When an end address is reached, the pre-decoder pulse generator 30 inhibits generating additional pulses. Note that any or all of the array decoders 32, 34, 36, 38, etc., may be set or reset upon a power-on sequence or other selected operation of processor 12.

In an alternate embodiment, the array decoders may receive a stream of pulses and shift a "1" down the chain of shift registers when appropriately enabled. The pulse stream may be monitored by the pre-decode pulse generator 30 which controls the shifting of the array decoders by an enable signal. In this alternate embodiment, pre-decode pulse generator 30 receives a present address for comparing against the stored previous address. When pre-decode pulse generator 30 detects that an appropriate number of pulses in the pulse stream have been received by the array decoders, pre-decode pulse generator 30 then deactivates the enable signal to the array decoders to prevent further shifting from occurring.

FIG. 4 illustrates another embodiment of address pulse generator and decoder 18 used with a column decoder in accordance with the present invention. In this embodiment address pulse generator and decoder 18 also includes a pre-decode pulse generator 30 and N array decoders, e.g., array decoders 32, 34, 36, 38, . . . , (N−1). As before, pre-decode pulse generator 30 receives ADDRESS LINES and generates a PULSE SIGNAL that is commonly supplied to the N array decoders. The N array decoders receive a BITLINE SIGNAL that may be used to gate or enable the decoders when generating the individual column select lines for accessing the memory core. Thus, in this embodiment, the array decoders generate column select lines that provide data to the appropriate sense amplifiers (not shown) of the memory core.

By now it should be apparent that the present invention enhances a decode for memories that use "sequential addressing". By appropriately supplying the appropriate number of pulses to the array decoders in the present invention, it is no longer necessary to use the binary decoding scheme as found in prior art circuitry.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An addressing circuit for a memory core, comprising:
   a generator to store a previous address and receive a current address, the generator to provide a number of pulses corresponding to a difference between the current address and the previous address; and
   a series of decoders to provide wordlines to a memory core, wherein outputs of the series of decoders activate wordlines in sequence according to the number of pulses.

2. The addressing circuit of claim 1 wherein the series of decoders receive a stream of pulses from the generator and a wordline signal to gate the generation of the wordlines.

3. The addressing circuit of claim 1 wherein the series of decoders are connected to form a shift register.

4. The addressing circuit of claim 1 wherein the series of decoders receive a reset signal.

5. The addressing circuit of claim 1 wherein the generator includes a statemachine to store the previous address, receive the current address and generate the number of pulses.

6. An addressing circuit for a memory core comprising:
   multiple array decoders to shift a logic one through a field of logic zeros wherein outputs of the multiple array decoders are coupled to the memory core; and
   a pulse generator coupled to receive a present address and control clock pulses to the multiple array decoders.

7. The addressing circuit of claim 6 wherein the pulse generator compares a previous address to the present address, then generates an appropriate number of the clock pulses to increment the previous address to the present address.

8. The addressing circuit of claim 6 wherein the pulse generator compares a previous address to the present address to determine a difference value and provide the clock pulses in accordance with the difference value.

9. The addressing circuit of claim 6 wherein the pulse generator monitors the clock pulses received by the multiple array decoders and limits the clock pulses to correspond to a difference value between the previous address and the present address.

10. The addressing circuit of claim 6 wherein the outputs of the multiple array decoders are coupled to wordlines of the memory core.

11. The addressing circuit of claim 6 wherein the outputs of the multiple array decoders are coupled to column select lines of the memory core.

12. A wireless system, comprising:
first and second antennas;
a transceiver coupled to the first and second antennas; and
a processor coupled to the transceiver, wherein the processor includes, a memory,
multiple decoders coupled to the memory to provide access to data within the memory, the multiple decoders arranged as a shift register, and
a generator to store a previous address and receive a current address and provide a number of pulses corresponding to a difference between the current address and the previous address to clock the shift register.

13. The wireless system of claim 12, wherein outputs of the multiple decoders are coupled to wordlines of the memory.

14. The wireless system of claim 12, wherein outputs of the multiple decoders are coupled to column select lines of the memory.

15. The wireless system of claim 12, wherein the memory is accessed using sequential addressing.

16. A method comprising:
receiving a current address in a memory providing clock pulses to a shift register that is reset during a power-on reset, wherein the clock pulses are limited by a difference in number of addresses from the current address to a previous address;
using the clock pulses to shift a logic one in a field of zeros in the shift register; and
using outputs of the shift register to drive wordlines and access data in the memory.

17. The method of claim 16, further comprising:
using outputs of the shift register to drive column select lines of the memory.

18. The method of claim 16 further including:
using sequential addressing to access the memory.

* * * * *